US005631647A

United States Patent [19]

Huang

[11] Patent Number: 5,631,647

[45] Date of Patent: May 20, 1997

[54] ANALOG MULTIPLYING TYPE OF DIGITAL/ANALOG CONVERTER CIRCUIT

[75] Inventor: Chi-Mao Huang, Dou-Liu, Taiwan

[73] Assignee: United Microelectronics Corporation, Taiwan

[21] Appl. No.: 321,713

[22] Filed: Oct. 12, 1994

[51] Int. Cl.[6] ..................... H03M 1/66

[52] U.S. Cl. ..................... 341/136; 341/144

[58] Field of Search ..................... 341/136, 144, 341/146

[56] References Cited

U.S. PATENT DOCUMENTS

| | | | |
|---|---|---|---|
| 4,583,076 | 4/1986 | Luschnig | 341/135 |
| 4,587,477 | 5/1986 | Hornak et al. | 323/312 |
| 5,218,364 | 6/1993 | Kumazawa et al. | 341/136 |
| 5,329,062 | 7/1994 | Kaneko | 84/603 |
| 5,369,406 | 11/1994 | Hughes | 341/135 |
| 5,394,146 | 2/1995 | Arimoto | 341/118 |

*Primary Examiner*—Marc S. Hoff

*Attorney, Agent, or Firm*—Barnes, Kisselle, Raisch, Choate, Whittemore & Hulbert, P.C.

[57] ABSTRACT

An improved digital/analog converter circuit of the analog multiplying type for providing an adjustment for a DC voltage offset. The digital/analog converter circuit generally comprises a code converter, an analog multiplying current source and a bridge output circuit. The code converter converts the values of the tone data into 2's complement numbers. The numbers are then sent into an analog multiplying current source where positive and negative signals are produced to control the current path of a bridge-type output.

8 Claims, 3 Drawing Sheets (PRIOR ART)

ANALOG MULTIPLYING TYPE OF DIGITAL/ANALOG CONVERTER CIRCUIT

FIELD OF THE INVENTION

The present invention generally relates to a circuit for a digital/analog converter and more particularly, relates to a circuit of a digital/analog converter of the analog multiplying type utilizing a code converter, an analog multiplying current source, and a bridge-type output circuit.

BACKGROUND OF THE INVENTION

In a conventional method of synthesizing melody, a melody is first divided into a tone wave and an envelope wave and then the two waves are multiplied together to obtain a synthesized sound wave. This is shown in FIGS. 1~3. FIG. 1 shows a conventional tone wave 10 plotted as a voltage vs time curve. An envelope wave shown in FIG. 2 is also plotted as a voltage vs time curve. Multiplying the tone 10 in FIG. 1 by the envelope wave 20 in FIG. 2, a composite sound wave 30 is obtained which is shown in FIG. 3. It should be noted that the composite sound wave 30 shown in FIG. 3 is obtained under ideal conditions, i.e. a hypothetical waveform.

In reality, the composite waveform 30 is more likely to have a shape of the directly composite waveform 40 shown in FIG. 4. This departure from the ideal form is mainly caused by the lack of adjustment for the DC voltage offset.

Traditionally, a melody can be synthesized in two ways. The first is a digital synthesizing method in which the digital data of the tone wave and the envelope wave are multiplied together by a multiplier. The product of the multiplication is then sent to a digital/analog converter in order to complete the synthesis of the melody wave. The shortcoming of this method is that it requires the additional component of a multiplier and a higher frequency range for the conversion system.

The second method of synthesizing a melody wave is an analog synthesizing method. However, due to the lack of adjustment for the voltage offset and the lack of adequate positive/negative signal processing of the digital/analog converter, a distorted sound wave is frequently generated. This is shown in FIG. 4. The sound wave 40 shown in FIG. 4 contains a variable DC value, it frequently causes an undesirable "pop" noise during the playback of the melody. In order to eliminate this "pop" noise, at least one coupling capacitor must be used to eliminate the variable DC component. And, a proper bias voltage/current is set to amplify for proper operating. This in turn increases the cost of the circuit.

It is therefore an object of the present invention to provide a digital/analog converter circuit of the analog multiplying type that does not have the shortcomings of the prior art digital/analog converter circuits.

It is another object of the present invention to provide a digital/analog converter circuit of the analog multiplying type that utilizes an analog synthesized circuit.

It is a further object of the present invention to provide a digital/analog converter circuit of the analog multiplying type that utilizes an analog synthesizing method to achieve both cost savings and efficiency improvement.

It is yet another object of the present invention to provide a digital/analog converter circuit of the analog multiplying type utilizing an analog synthesizing method that has the components of a code converter, an analog multiplying current source, and a bridge output circuit.

SUMMARY OF THE INVENTION

In accordance with the present invention, an improved digital/analog converter circuit of the analog multiplying type with no DC component is provided.

In the preferred embodiment, the digital/analog converter circuit comprises three major element: of a code converter, an analog multiplying current source, and a bridge output circuit. The code converter converts the values of the tone data into 2's complement numbers, the numbers are then sent into an analog multiplying current source where positive and negative signals are produced to control the current path of a bridge-type output.

BRIEF DESCRIPTION OF THE DRAWINGS

Other objects, features and advantages of the present invention will become apparent upon consideration of the specification and the appended drawings, in which.

DETAILED DESCRIPTION OF THE PREFERRED EMBODIMENT

Figure 1:
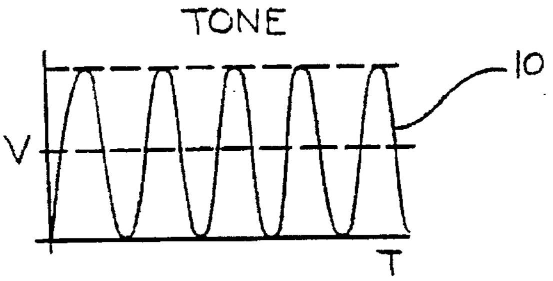
FIG. 1 is a graph showing the tone wave component of a sound wave.
Figure 2:
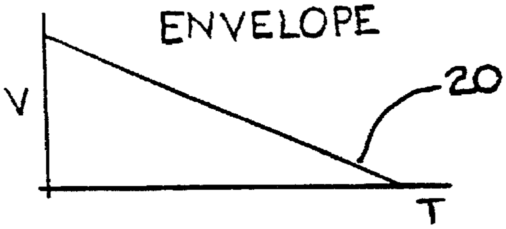
(PRIOR ART) FIG 2
FIG. 2 is a graph showing the envelop wave component of a sound wave.
Figure 3:
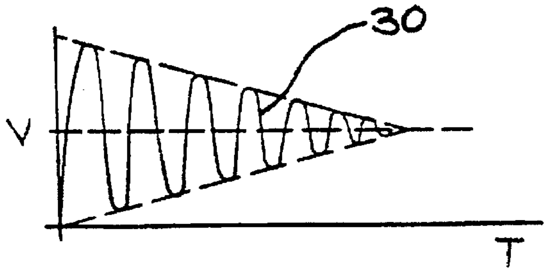
(PRIOR ART) FIG 3
FIG. 3 is a graph showing a hypothetical composite sound wave.
Figure 4:
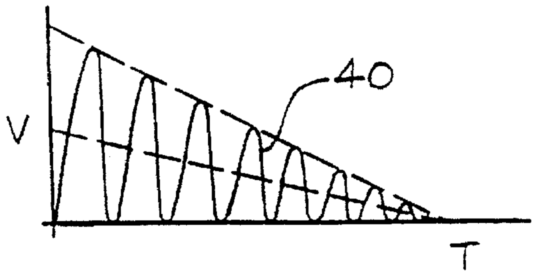
(PRIOR ART) FIG 4
FIG. 4 is a graph showing a directly composite sound wave.
Figure 5:
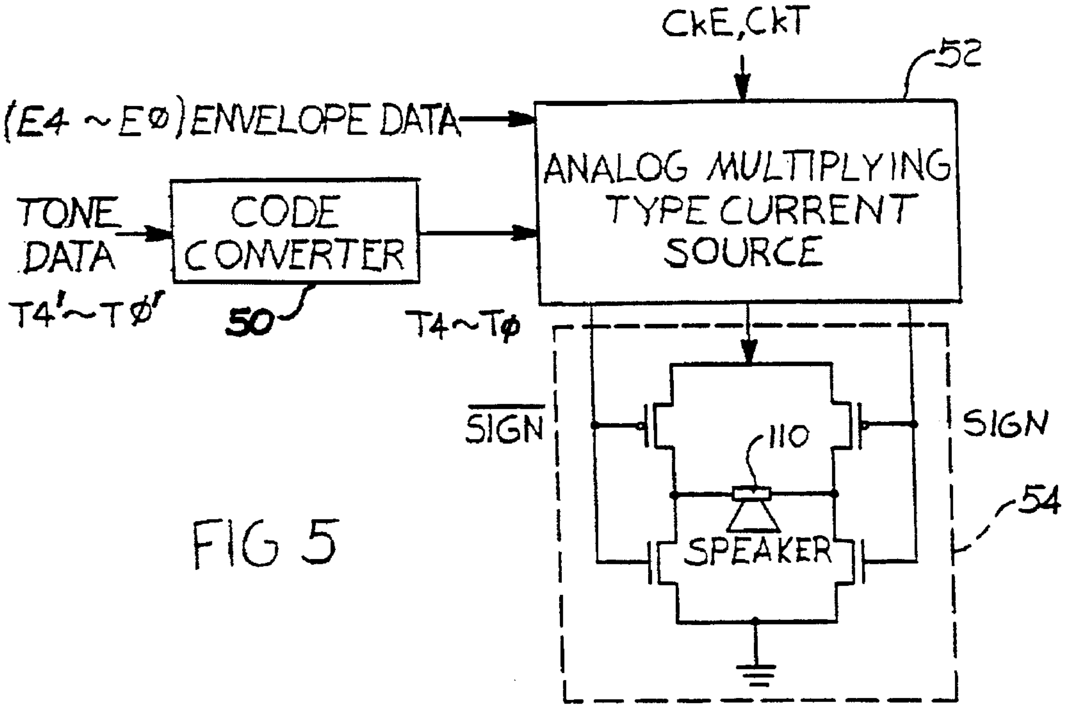
FIG. 5 is a circuit diagram of the present invention digital/analog converter.

The present invention of a digital-to-analog converter circuit of the analog multiplying type is shown in FIG. 5. It comprises three major functional blocks, namely, a code converter 50, an analog multiplying current source 52, and a bridge-type output circuit 54.

Figure 6:
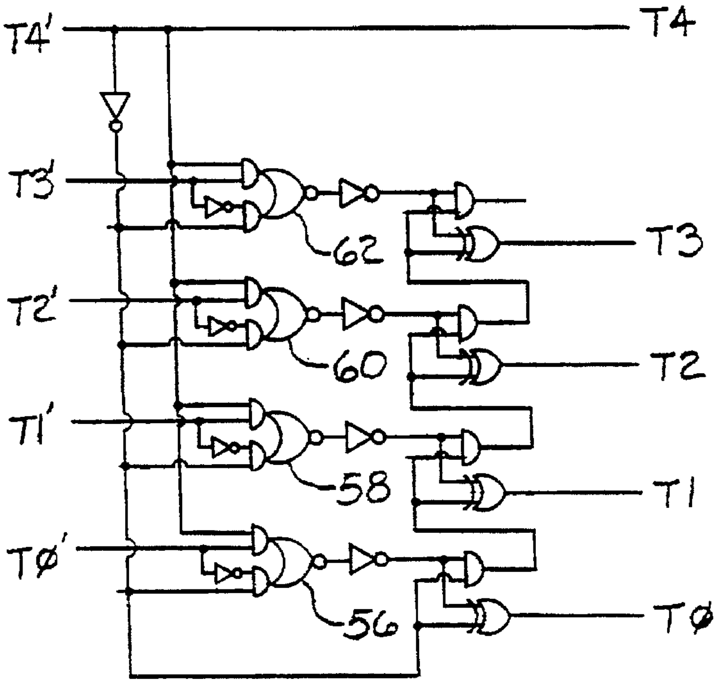
FIG. 6 is a logic diagram for the code converter shown in FIG. 5.

Code converter 50, presented on a circuit diagram of FIG. 6, transforms the tone data coded in $T_4'$~$T_0'$ combinations into 2's complement numerals represented by $T_4$~$T_0$. The highest bit $T_4$ is used for designating negative (with $T_4$=0) and positive ($T_4$=1) numbers. Other bits of $T_3$~$T_0$ correspond to absolute values of numbers as shown in Table 1. For five-bit words used as an example, code converter 50 comprises four AND-OR-INVERT (AOI) gates 56~62, one AOI gate for each bit in a word, except MSB. The AOI gates serve as selectors for positive sign/negative sign signals and can be substituted by multiplexers.

TABLE 1

| $T_4'$ | $T_3'$ | $T_2'$ | $T_1'$ | $T_0'$ | $T_4$ | $T_3$ | $T_2$ | $T_1$ | $T_0$ | |
|---|---|---|---|---|---|---|---|---|---|---|
| 1 | 1 | 1 | 1 | 1 | 1 | 1 | 1 | 1 | 1 | +15 |
| | | . | | | | | . | | | . |
| | | . | | | | | . | | | . (Positive Values) |
| | | . | | | | | . | | | . |
| 1 | 0 | 0 | 1 | 0 | 1 | 0 | 0 | 1 | 0 | +2 |
| 1 | 0 | 0 | 0 | 0 | 1 | 0 | 0 | 0 | 1 | +1 |
| 1 | 0 | 0 | 0 | 0 | 1 | 0 | 0 | 0 | 0 | 0(Median Value) |
| 0 | 1 | 1 | 1 | 1 | 0 | 0 | 0 | 0 | 1 | −1 |
| 0 | 1 | 1 | 1 | 0 | 0 | 0 | 0 | 1 | 0 | −2(Negative Values) |
| | | . | | | | | . | | | . |
| | | . | | | | | . | | | . |
| | | . | | | | | . | | | . |
| 0 | 0 | 0 | 0 | 1 | 0 | 1 | 1 | 1 | 1 | −15 |

Referring now to Table 1, it is to be noted that the data on the left-hand side of Table 1 are raw data, while the data on the right-hand side are treated data. In the right-hand side, all negative values are two's complements of the positive ones, and they are obtained by subtracting the magnitude of the number from $2^4$ where 4 is a word length. It can be seen, for example, that −2 presented as 0010 in the binary form in the right-hand side of Table 1, with $T_4$=0 designating minus, is a complement of $2^4-2=14$, presented as 1110 on the same line in the left-hand side of the Table 1.

Figure 7:
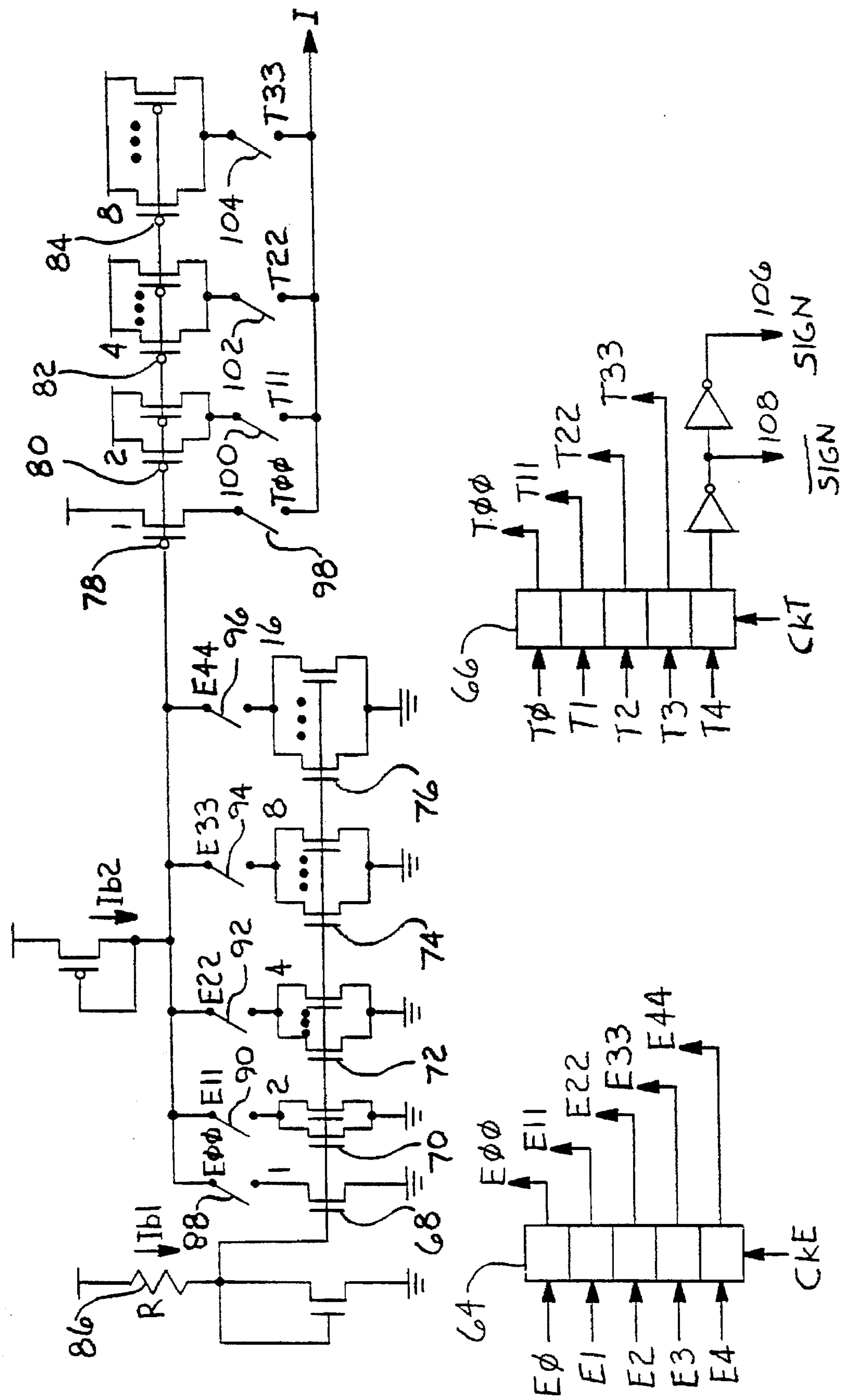
FIG. 7 is a circuit diagram for the analog multiplying current source shown in FIG. 5.

After having been converted in converter 50, the numbers are then sent into an analog multiplying current source 52 shown in FIG. 7. Envelope data coded in $E_4$~$E_0$ combinations are input into a CkE register 64 controlled by clock pulses CkE. At the same time, tone data $T_4$~$T_0$ converted from input tone data $T_4'$~$T_0'$ in the code converter 50, are loaded into a CkT register 66 controlled by clock pulses CkT. Output coded values $E_{44}$~$E_{00}$ and $T_{33}$~$T_{00}$ are produced from corresponding registers 64, 66 synchronously with clock pulses eke and CkT, respectively. The most significant bit T4 produces positive and negative signals for controlling the current path of bridge-type output circuit 54.

There are two sets of groups of MOSFETs shown in FIG. 7. The first set is formed by groups 68~76. Group 68 comprises one MOSFET, groups 70~76 comprises two, four, eight, and sixteen MOSFETs respectively, MOSFETs in each of groups 70~76 are connected in parallel to each other. Similarly, the second set of groups 78~84 is made up of MOSFETs in such a way that group 78 has one MOSFET, and groups 80~84 comprise two, four, and eight MOSFETs respectively, MOSFETs in each of groups 80~84 being connected in parallel to each other.

A resistor 86 serves to adjust the value of Ib1 used to control MOSFETs of groups 68~76.

There is a switch 88 connected in series with group 68, and each of switches 90~96 is connected to a respective group 70~76. Switches 88~96 are controlled by output coded values $E_{00}$~$E_{44}$, respectively. Serial circuits, each of which is composed of one of groups 68~76 and respective one of switches 88~96, are connected in parallel to each other. They control MOSFET groups 78~84. The magnitude of current Ib2 which is the DAC bias current, depends on which switches 88~96 are closed. In other words, the current that controls groups 78~84 depends on the values representing the envelope signal.

There is also provided a switch 98 connected in series with group 78, and a group of switches 100~104 each of which is connected in series with a respective group 80~84. The magnitude of current I depends on which combination of switches 98~104 is closed. These switches are controlled by signals $T_{00}$~$T_{33}$ respectively and thus the operation of the switches represents the tone signal. In such a manner, the value of I is proportional to the product of the envelope wave and the tone wave values.

The value of $T_4$ only affects the path of bridge-type output circuit 54. As shown in FIG. 7, output for $T_4$ in CkT register 66 provides outputs for positive 106 and negative 108 signs that control operation of the third major component of the present invention bridge-type output circuit 54. It should be also appreciated that in FIG. 7 the envelope wave and the tone wave positions can be exchanged without affecting the multiplying function of the converter.

Bridge-type output circuit 54 shown in FIG. 5 has a speaker 110 in a diagonal of the bridge. Current I reflecting the synthesized signal operates the speaker, the path of I being determined by $T_4$ (negative sign/positive sign). It provides an analog multiplying output by the positive/negative signal with no direct current to drive the speaker.

In the case of a multi-channel synthesizer, it can be achieved by using higher frequency CkT/CkE signals in order to match the envelope/tone signal input and to achieve the result by time sharing.

While the present invention has been described in an illustrative manner, it should be understood that the terminology used is intended in a nature of words of description rather than of limitation.

Furthermore, while the present invention has been described in terms of one preferred embodiment thereof, it is to be appreciated that those skilled in the art will readily apply these teaches to other possible variations of the invention.

The embodiments of the invention in which an exclusive property or privilege is claimed are defined as follows:

1. A digital/analog converter circuit of the analog multiplying type for providing an adjustment for a DC voltage offset, said circuit comprising:

a code converter for obtaining the magnitude and positive/negative sign of a tone data by a decoding method of 2's complement, an analog multiplying current source wherein an envelope signal is used to determine the DAC bias current, a tone signal is used to control an output current the magnitude of which is proportional to the product of the envelope signal and the tone signal, and a bridge output circuit which determines a current path depending on the positive or negative sign of the tone signal for driving a speaker output with no direct current component, said bridge output circuit not having a capacitively coupled component.

2. A circuit according to claim 1, wherein said analog multiplying current source comprises a first register providing said envelope signal data, a second register providing said tone signal data, and a first and second set of MOSFET groups controlled by said envelope signal data and said tone signal data, respectively, each of said groups in said first set and in said second set of MOSFET groups representing a corresponding bit position in an envelope signal data word and in a tone signal data word, respectively, so that a number of MOSFETs in each of said groups corresponds to $2^N$ where N is said bit position, each of said groups in said first set being connected in series with a contact representing a respective bit position in said envelope signal data word and said serial connections of said groups and said contacts in said first set being connected in parallel, each of said groups in said second set being connected in series with a contact representing a respective bit position in said tone signal data word, said serial connections of said groups and said contacts in said second set being connected in parallel, one of said sets providing a controlling current for another set, said another set providing a current for driving said speaker.

3. A digital/analog converter circuit of the analog multiplying type for providing an adjustment for a DC voltage offset, said circuit comprising a code converter utilizing a 2's complement code converting technique to obtain the magnitude and the positive/negative sign of a tone data, said code converter being connected to an analog multiplying current source and a bridge-type output circuit not having a capacitively coupled component.

4. A circuit according to claim 3, wherein said analog multiplying current source utilizes an envelope wave signal to determine a DAC bias current and a tone signal to determine an output current where the magnitude of the current is proportional to the product of an envelope wave multiplied by a tone wave.

5. A circuit according to claim 3, wherein said bridge output circuit determines a current path based on the positive or negative sign of the tone data and provides a signal to drive a speaker which has no direct current component.

6. A circuit according to claim 3, wherein the envelope wave signal is used to determine the output circuit and the tone wave signal is used to determine the DC bias circuit.

7. A circuit according to claim 3, wherein a frequency is increased and handled by a time sharing method to control the bridge-type output circuit to achieve a multi-channel effect.

8. A circuit according to claim 3, wherein the tone input is used to control a tone/voice/speech data and the envelope input is used to control the volume such that a multiple stage volume controlled music synthesizer can be achieved without said voltage offset DC.

* * * * *